US008699291B1

(12) United States Patent
Ch'ng et al.

(10) Patent No.: US 8,699,291 B1
(45) Date of Patent: Apr. 15, 2014

(54) MEMORY CIRCUITRY WITH DYNAMIC POWER CONTROL

(75) Inventors: Chin Ghee Ch'ng, Gelugor (MY); Wei Yee Koay, Bayan Lepas (MY); Boon Jin Ang, Butterworth (MY)

(73) Assignee: Altera Corporation, San Jose, CA (US)

( * ) Notice: Subject to any disclaimer, the term of this patent is extended or adjusted under 35 U.S.C. 154(b) by 76 days.

(21) Appl. No.: 13/415,052

(22) Filed: Mar. 8, 2012

(51) Int. Cl.
*G11C 5/14* (2006.01)

(52) U.S. Cl.
CPC ................................. *G11C 5/147* (2013.01)
USPC .................... 365/226; 365/233.11; 365/233.1; 365/191; 365/233.17; 365/203

(58) Field of Classification Search
CPC ............. G11C 2207/2281; G11C 7/06; G11C 7/1018; G11C 8/18
USPC ............... 365/226, 227, 229, 233.11, 233.12, 365/191, 189.09, 203
See application file for complete search history.

(56) References Cited

U.S. PATENT DOCUMENTS

| | | | |
|---|---|---|---|
| 6,839,299 | B1 | 1/2005 | Bhavnagarwala et al. |
| 7,190,187 | B2 | 3/2007 | Hua et al. |
| 7,414,878 | B1 | 8/2008 | Christensen et al. |
| 7,715,221 | B2 | 5/2010 | Christensen et al. |
| 7,808,856 | B2 | 10/2010 | Ehrenreich et al. |
| 2005/0122821 | A1 | 6/2005 | Redwine et al. |
| 2011/0090753 | A1* | 4/2011 | Lee et al. ........................ 365/226 |

OTHER PUBLICATIONS

Lyer, "Demystify power gating and stop leakage cold", Mar. 3, 2006, [online], retrieved Dec. 14, 2011, <http://www.powerdesignindia.co.in/STATIC/PDF/200811/PDIOL__2008NOV06__PMNG__TA__03.pdf?SOURCES=DOWNLOAD>.
"Power Grating," Apr. 2008, [online], retrieved Dec. 14, 2011, <http://asic-soc.blogspot.com/2008/04/power-gating.html>.
Zhang et al, "SRAM Design on 65-nm CMOS Technology With Dynamic Sleep Transistor for Leakage Reduction", Solid-State Circuits, IEEE Journal of Start p. 895 End p. 901 ISSN: 0018-9200 ISBN: vol. 40 Issue: 4.
Lach et al., "A General Post-Processing Approach to Leakage Current Reduction in SRAM-Based FPGAs," CCD '04 Proceedings of the IEEE International Conference on Computer Design, IEEE Computer Society Washington, DC, USA © 2004, ISBN:0-7695-2231-9, 2005.

* cited by examiner

*Primary Examiner* — Thong Q Le
(74) *Attorney, Agent, or Firm* — Treyz Law Group; David C. Kellogg

(57) ABSTRACT

Circuits and techniques for operating a memory circuit are disclosed. A disclosed circuit includes a memory circuit and a sleep circuit with an output terminal coupled to the memory circuit. The sleep circuit is operable to receive a control signal and further operable to place the memory circuit in different modes of operation. The memory circuit may be placed in either a first mode of operation, a second mode of operation or a third mode of operation based at least partly on the control signal. An input terminal of the sleep circuit is coupled to an output terminal of the control circuit. The control circuit is operable to receive an enable signal and is operable to supply the control signal to the sleep circuit at first, second and third voltage levels during the first, second and third modes of operation, respectively, based on the enable signal and a clock signal.

19 Claims, 5 Drawing Sheets

MEMORY CIRCUITRY WITH DYNAMIC POWER CONTROL

BACKGROUND

Programmable logic devices typically include embedded memory blocks that may be used to store configuration data. For instance, a static random access memory (SRAM) module on a programmable logic device (e.g., a field programmable gate array (FPGA)) may be used to store configuration data loaded from a non-volatile memory module upon the power up of the programmable logic device.

As the programmable device needs to read data to and from the SRAM module during operation, the SRAM module may affect the overall performance of the programmable device. For instance, power leakage in embedded memory modules may contribute to increased power consumption in a programmable device.

Generally, in order to reduce power leakage, unused embedded memory blocks (e.g., SRAM blocks) may be switched off or powered down and only used memory blocks are turned on. As such, memory blocks may be turned on and off based on specific user configurations.

In order to further reduce power leakage, memory blocks may also be turned on or off based on different operating modes. For instance, a programmable device may be placed in a standby mode when not in active use, and in order to reduce power consumption, embedded memory modules may be turned off during standby mode. In this instance, the embedded memory modules are only turned on when the programmable device is in active operating mode.

However, the embedded memory modules may be volatile memory modules that may not be able to retain stored configuration data once turned off. Therefore, in order to ensure stored configuration data are not lost, the embedded memory modules may not be turned off even when the programmable device is in standby mode.

As such, there may still be power leakage even when the programmable device is in standby mode because the embedded memory modules may still need to be powered to prevent unwanted loss of data.

SUMMARY

A dynamic power control circuit is needed to dynamically provide different levels of voltages to embedded memory modules in order to reduce power leakage in the embedded memory modules. Embodiments of the present invention include circuits and techniques to supply a lower voltage level to inactive memory modules, without entirely powering down those inactive memory modules.

It is appreciated that the present invention can be implemented in numerous ways, such as a process, an apparatus, a system, a device, and a method on a computer readable medium. Several inventive embodiments of the present invention are described below.

In one embodiment, a circuit is disclosed. The disclosed circuit includes a memory circuit, a sleep circuit, and a control circuit. An output terminal of the sleep circuit is coupled to the memory circuit. The sleep circuit is operable to receive a control signal and is further operable to place the memory circuit in one of a first mode of operation, a second mode of operation, and a third mode of operation based at least partly on the control signal. An input of the sleep circuit is coupled to an output of the control circuit. The control circuit is operable to receive an enable signal and is operable to supply the control signal to the sleep circuit at different voltage levels during different modes of operation.

In another embodiment, a circuit that is operable to generate power supply signals for a memory element is disclosed. The circuit includes a logic circuit having an output terminal and first and second input terminals coupled to receive an enable signal and a clock signal, respectively. A gate of a first transistor is coupled to receive the enable signal and a second transistor is coupled in series to the first transistor. The gate of the second transistor is coupled to receive the clock signal. A source-drain terminal of the second transistor is coupled to the output terminal of the logic circuit. The circuit is operable to generate the power supply signals for the memory element at one of first, second and third voltage levels based on the enable signal and the clock signal.

In yet another embodiment, a method of operating a memory circuit in an integrated circuit is disclosed. The method includes operating the memory circuit in an active mode by providing a first power supply voltage to a power supply terminal in the memory circuit. The memory circuit is operated in an idle mode by providing a second power supply voltage to the power supply terminal in the memory circuit. The memory circuit may retain stored data while the memory circuit is in the idle mode. Operation of the memory circuit is switched between the active and idle modes in response to a clock signal in the integrated circuit.

Further features of the invention, its nature and various advantages will be more apparent from the accompanying drawings and the following detailed description of the preferred embodiments.

DETAILED DESCRIPTION

The embodiments provided herein include circuitry and techniques to dynamically provide multiple levels of voltages to a memory circuit based on different operating modes.

It will be obvious, however, to one skilled in the art, that the present exemplary embodiments may be practiced without some or all of these specific details. In other instances, well-known operations have not been described in detail in order not to unnecessarily obscure the present embodiments.

Generally, programmable devices include embedded memory modules or memory blocks that may be placed in different operating modes. For instance, the memory blocks may be placed in active mode when performing read and write operations and may be placed in a sleep mode or an idle mode when not performing a read or write operation. In order to reduce power consumption without losing any of the data stored in the memory blocks, unused memory blocks may be powered down while idle memory blocks may be provided with a reduced voltage level to ensure stored data may be retained.

One of the embodiments describes a voltage control circuit that may be used to provide different levels of voltages to a memory circuit on a programmable device depending on a current operating mode of the programmable device. For instance, a reduced voltage level may be supplied to the memory circuit when the programmable device is in an idle mode. In an exemplary embodiment, the memory circuit may retain previous stored data with the reduced voltage. A higher voltage level may be supplied to the memory circuit when the programmable device reading from or writing to the memory circuit. As another example, depending on a user configuration, unused memory circuits or blocks in the programmable device may be turned off using a control signal. With the voltage control circuit providing different levels of voltages to the memory circuit, leakage power may be reduced when the memory circuit is in idle mode.

Figure 1:
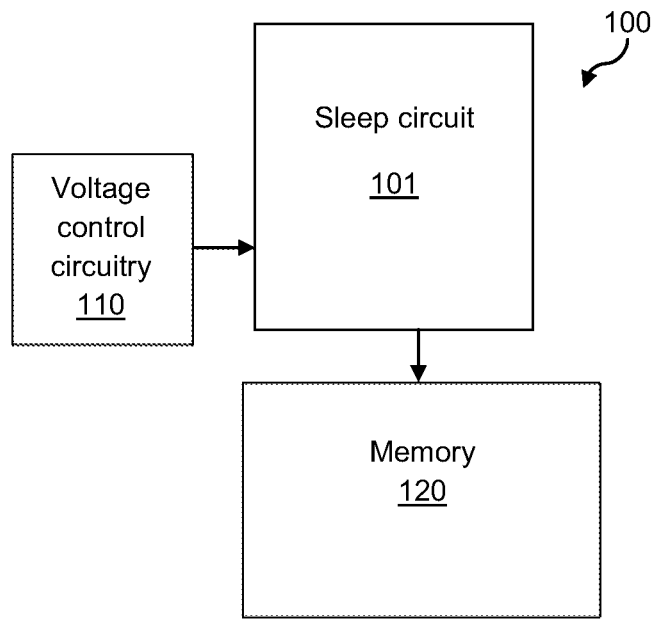
FIG. 1 is a block diagram of an illustrative memory block coupled to a voltage control circuitry block through a sleep circuit in accordance with an embodiment of the present invention.

FIG. 1, meant to be illustrative and not limiting, shows a block diagram of memory block 120 coupled to voltage control circuitry block 110 through sleep circuit 101. In an exemplary embodiment, sleep circuit 101 may be turned on or off by voltage control circuitry block 110. In one embodiment, voltage control circuitry block 110, details of which will be explained in subsequent sections to follow, may supply different levels of voltages to memory block 120 based on an operating mode of memory block 120. As an example, voltage control circuitry may supply a first voltage level when memory block 120 is performing a read or a write operation and may supply a second voltage level that is relatively lower than the first voltage level when memory block 120 is in an idle mode.

Figure 2:
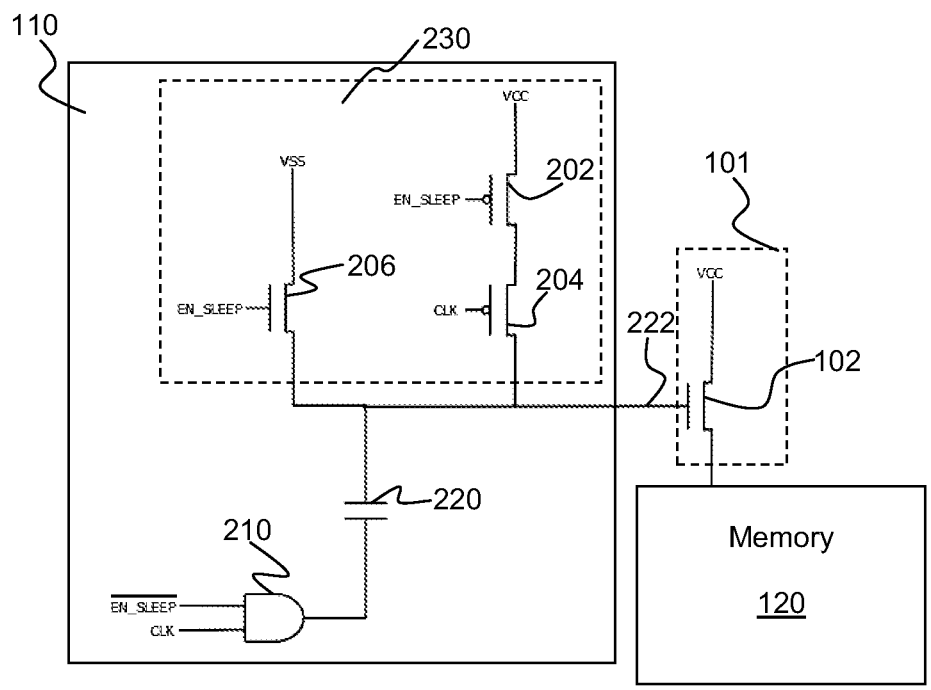
FIG. 2 is an illustrative schematic diagram of the voltage control circuitry block coupled to the sleep circuit in accordance with an embodiment of the present invention.

FIG. 2, meant to be illustrative and not limiting, shows a more detailed representation of voltage control circuitry block 110 coupled to sleep circuit 101 as one embodiment in accordance with the present invention. In one embodiment, sleep circuit may include N-channel transistor 102. A source-drain terminal of transistor 102 may be connected to a voltage level (e.g., VCC) and the gate of transistor 102 may be connected to voltage control circuitry block 110. Voltage control circuitry block 110 may include logic circuit 210 coupled to capacitor 220 and precharge circuit 230.

In one embodiment, precharge circuit 230 may include transistors 202 and 204 coupled in series and coupled to transistor 206. The three transistors 202, 204 and 206 may be coupled together with capacitor 220 to form output terminal 222 of voltage control circuitry block 110. Output terminal 222, coupled to the gate of transistor 102, may provide different voltage levels to transistor 102 based on enable signal, EN_SLEEP, and clock signal, CLK, received at voltage control circuitry block 110.

In one embodiment, enable signal EN_SLEEP may be a configuration bit stored in a configuration random access memory (CRAM) module. The configuration bit may be programmed according to a user design, as an example. Clock signal CLK may be a clock signal from a programmable device. In an exemplary embodiment, the duty cycle of clock signal CLK may depend on a read/write speed of the memory circuit block (e.g., memory circuit block 120) that is controlled by voltage control circuitry block 110.

As shown in the embodiment of FIG. 2, logic circuit 210 may be an AND gate with two input terminals. One input terminal of logic circuit 210 may be coupled to an inverted version of the enable signal and another input terminal may be coupled to clock signal CLK. In one embodiment, transistors 202 and 204 may be P-channel transistors and a source-drain terminal of transistor 202 may be coupled to a positive voltage level VCC. Transistor 206 may be an N-channel transistor with a source-drain terminal coupled to a ground voltage VSS.

The gate of transistor 206 may be coupled to receive enable signal EN_SLEEP. The gate of transistor 202 may also be coupled to the enable signal, EN_SLEEP, while the gate of transistor 204 may be coupled to receive clock signal CLK. Therefore, transistors 202 and 206 may be turned on or off based on enable signal EN_SLEEP and transistor 204 may be turned on or off based on clock signal CLK. In an exemplary embodiment, enable signal EN_SLEEP may be set to a logic high level or a logic low level based on an operating mode of memory circuit block 120.

Figure 3A:
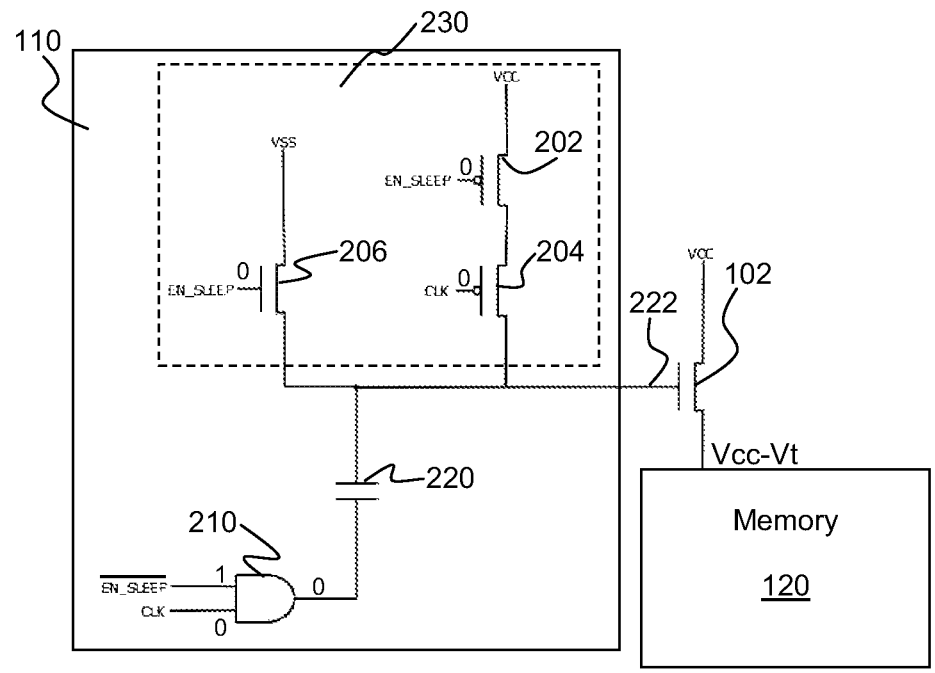
FIG. 3A is an illustrative schematic diagram of the voltage control circuitry block receiving an enable signal, EN_SLEEP, and a clock signal, CLK, at different logic levels when a memory circuit block is in an inactive mode in accordance with an embodiment of the present invention.

FIG. 3A, meant to be illustrative and not limiting, shows signals EN_SLEEP and CLK at a common logic level when memory circuit block 120 is in an inactive mode.

In one embodiment, memory circuit block 120 is in an inactive mode or in an idle mode when memory circuit block 120 is not performing either a read or write operation. Memory circuit block 120 may be in an idle mode when enable signal EN_SLEEP is at a logic low level and clock signal CLK is at a logic low level. In one embodiment, memory circuit block 120 may automatically switch from an active mode to an idle mode when enable signal EN_SLEEP is at a logic low level and clock signal CLK is at a logic low level, and may automatically return to the active mode when clock signal CLK switches from the logic low level to a logic high level while enable signal EN_SLEEP remains at a logic low level. As enable signal EN_SLEEP is at a logic low level transistor 206 is turned off by the logic low level of EN_SLEEP while transistor 202 is turned on by the logic low level of EN_SLEEP.

As the inverted version of EN_SLEEP is at a logic high level, logic circuit 210 may output a logic high or a logic low value based on the logic level of clock signal CLK. In an exemplary embodiment, during idle mode, clock signal CLK is at a logic low level. Therefore, logic circuit 210 may output a logic low level and transistor 204 may be turned on by the logic low level of clock signal CLK. As both transistors 202 and 204 are turned on, precharge circuit 230 is turned on and may charge capacitor 220 during idle mode.

As capacitor 220 is being charged, there is no extra voltage supplied by voltage control circuitry block 110 to the gate of transistor 102 during idle mode. As such, a non-boosted voltage level may be supplied to transistor 102 (e.g., VCC).

Transistor 102 may thus supply a relatively lower voltage, VCC-Vt, to memory circuit block 120 due to the voltage drop, Vt, at transistor 102. The lower voltage level supplied may reduce the power leakage at memory circuit 120 when the memory circuit block 120 is in an idle mode. In one embodiment, the voltage level supplied, VCC-Vt, is a minimum level of voltage required for memory circuit block 120 to retain its previous stored data. Therefore, data is not lost when the memory circuit block is supplied with a relatively lower voltage level when memory circuit block 120 is in an idle mode.

Figure 3B:
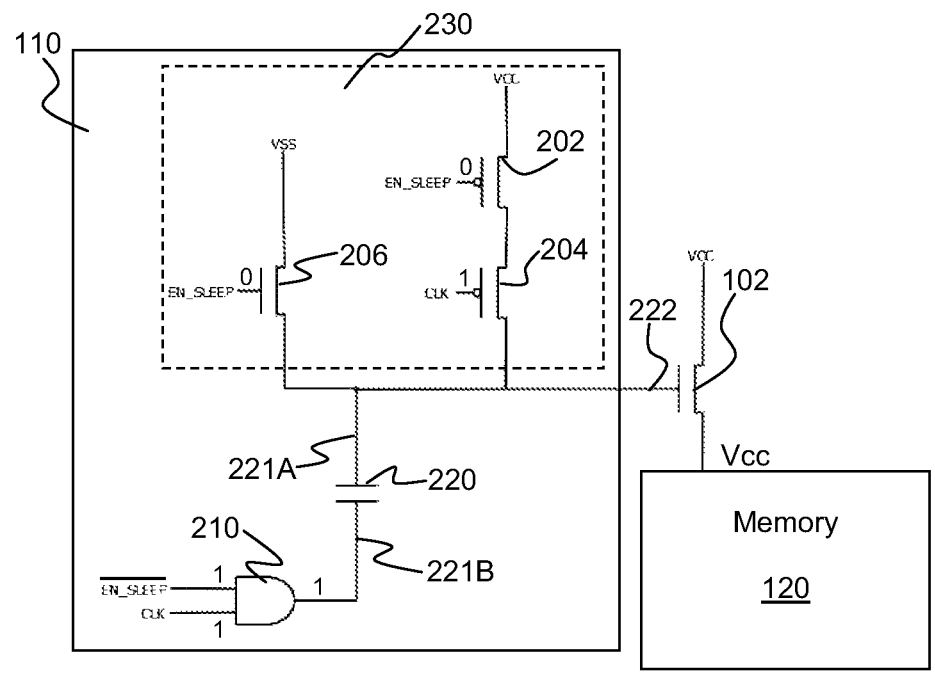
FIG. 3B is an illustrative schematic diagram of the voltage control circuitry block receiving the enable signal, EN_SLEEP, and clock signal, CLK, at different logic levels when the memory circuit block is in an active mode in accordance with an embodiment of the present invention.

FIG. 3B, meant to be illustrative and not limiting, shows signals EN_SLEEP and CLK at different logic levels when memory circuit block 120 is in an active mode.

In one embodiment, memory circuit block 120 is in an active mode when enable signal EN_SLEEP is at a low logic level and clock signal CLK is at a logic high level.

When memory circuit block 120 is in active mode, logic circuit 210 outputs a logic high level as both the inverted version of the enable signal and clock signal CLK are at a logic high level. Transistor 206 may be turned off as enable signal EN_SLEEP is at a logic low level. Conversely, transistor 202 may be turned on as the enable signal, EN_SLEEP, is at a logic low level. As clock signal CLK is at a logic high level, transistor 204 may be turned off. Consequently, precharge circuit 230 may be turned off during active mode.

As capacitor 220 has been charged to a positive voltage level that is substantially close to VCC (e.g., the voltage at capacitor terminal 221A is greater than the voltage at capacitor terminal 221B by an amount approximately equal to the positive power supply voltage VCC), voltage control circuitry block 110 may output a boosted voltage level, i.e., approximately 2×VCC, at output terminal 222, when logic gate 210 drives voltage signal VCC (e.g., a logic one signal) onto terminal 221B. The gate of transistor 102 may then be charged to approximately twice the voltage level of VCC. As such, the voltage level supplied by transistor 102 to memory circuit block 120 may increase and may be approximately equal to VCC (e.g., rather than VCC-Vt). In one embodiment, memory circuit block 120 may be performing a read or a write operation when a full voltage level, VCC, is supplied from transistor 102.

Figure 3C:
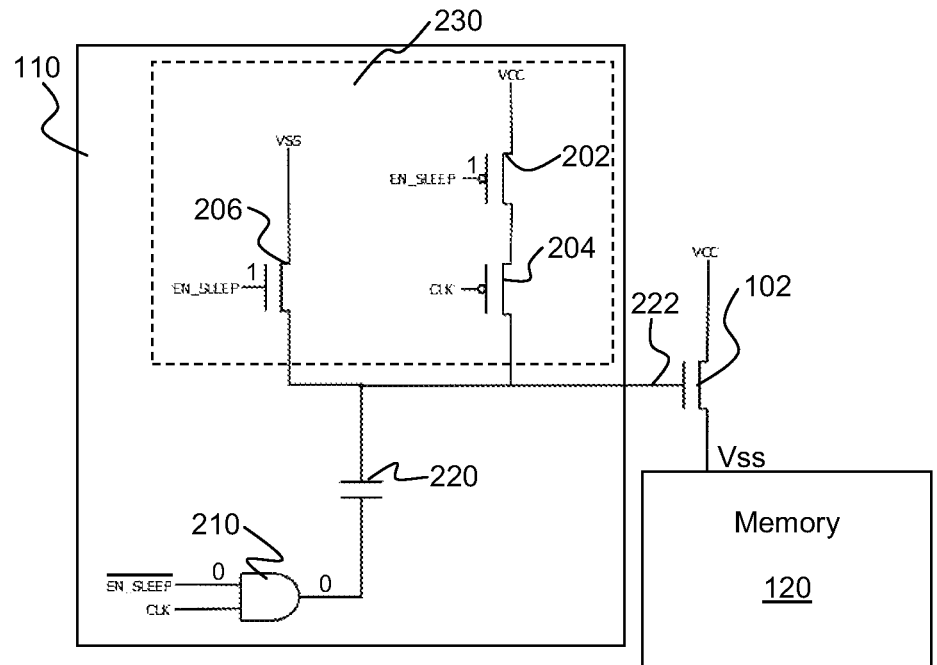
FIG. 3C is an illustrative schematic diagram of the voltage control circuitry block receiving the enable signal, EN_SLEEP, and clock signal, CLK, at different logic levels when a memory circuit block is in a sleep mode or an unused mode in accordance with an embodiment of the present invention.

FIG. 3C, meant to be illustrative and not limiting, shows enable signal EN_SLEEP at a logic high level when memory circuit block 120 is in a sleep mode or an unused mode. When enable signal EN_SLEEP is at a logic high level, transistor 206 is turned on while transistor 202 is turned off. As such, precharge circuit 230 is turned off and a ground potential, VSS, may be supplied to the gate of transistor 102.

In the embodiment of FIG. 3C, the inverted version of the enable signal is at logic low level, logic circuit 210 outputs a logic low level and capacitor 220 may not be charged. As a ground potential, VSS, may be supplied to the gate of transistor 102, memory circuit block 120 may be powered down during sleep mode. In one embodiment, the sleep mode may be applied on memory blocks (e.g., memory circuit block 120) that may not be accessed for a relatively long period of time. In another embodiment, the enable signal, EN_SLEEP, may be used to power down unused memory blocks.

Figure 4:
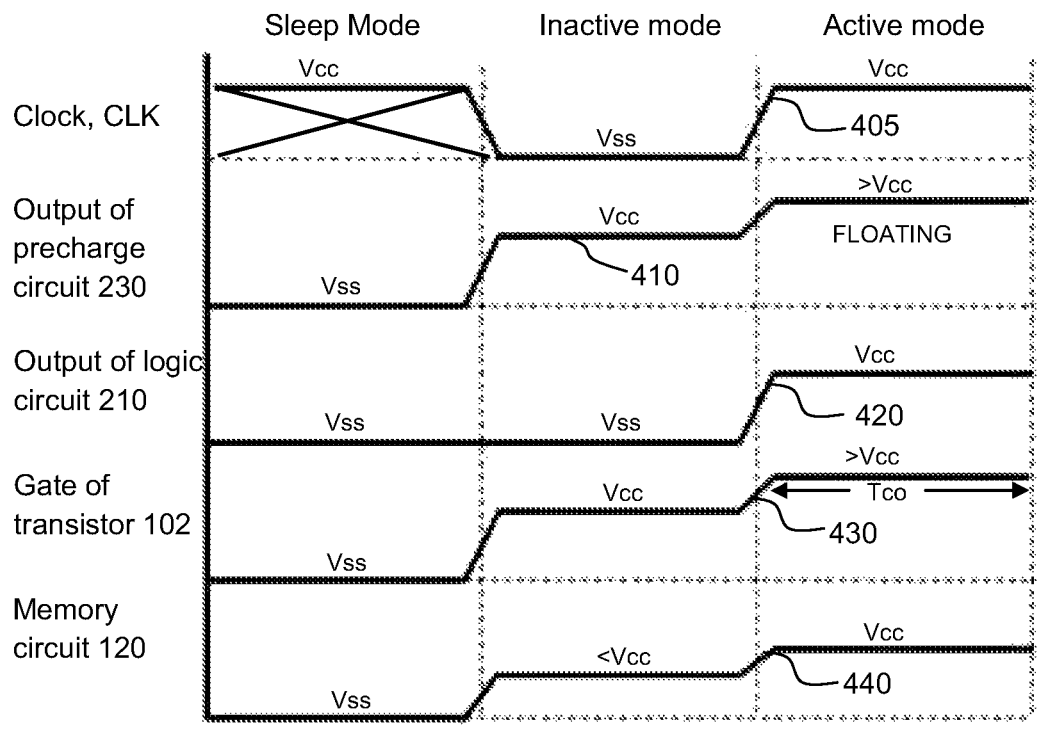
FIG. 4 shows exemplary waveforms of a clock signal, and voltage levels at a precharge circuit, an output of a control circuit, a gate of a transistor, and a memory circuit during different operating modes in accordance with an embodiment of the present invention.

FIG. 4, meant to be illustrative and not limiting, shows waveforms representing the voltage level at different circuit blocks during different operating modes as one embodiment in accordance with the present invention. Waveform 405 may represent the clock signal, CLK, and waveforms 410, 420, 430 and 440 may represent the voltage levels, respectively, at precharge circuit 230, the output of logic circuit 210, the gate of transistor 102, and memory circuit block 120 of FIGS. 3A-3C during sleep mode, inactive mode, and active mode.

In the embodiment of FIG. 4, during sleep mode or unused mode, a low voltage level (e.g., a ground potential, VSS) is seen at precharge circuit 230, the output of circuit 210, the gate of transistor 102 and memory circuit block 120. As such, in an exemplary embodiment, memory circuit block 120, precharge circuit 230 and transistor 102 may be turned off during sleep mode. In one embodiment, an enable signal, such as (EN_SLEEP) of FIGS. 3A-3C, may be used to turn off transistor 102. Consequently, memory circuit 120 may be powered down by the enable signal and the clock signal, CLK, as represented by waveform 405, may not affect precharge circuit 230 and memory circuit 120 as shown in FIG. 4.

During inactive mode, for instance, when memory circuit 120 is retaining previous stored data and not performing either a read or a write operation, the output of logic circuit 210, as shown by waveform 420, remains at a logic low level, precharge circuit 230 may be charged to a positive voltage level or a logic high level, such as VCC, as shown by waveform 410. The gate of transistor 102 may also be charged to a logic high level, as shown by waveform 430. Consequently, as shown by waveform 440, a voltage level that is relatively lower than VCC may be supplied to memory circuit 120 through transistor 102.

When memory circuit 120 switches to active mode (e.g., when memory circuit 120 is performing either a read or a write operation) the output of precharge circuit 230 may be floating as represented by waveform 410 (e.g., may not be directly connected to a power supply voltage). In the active mode, the output of logic circuit 210, as represented by waveform 420, is at a logic high level, VCC and the gate of transistor 102 is boosted to a positive voltage level that is greater than VCC, as represented by waveform 430. In an exemplary embodiment, the voltage level stored by capacitor 220 of FIG. 3A during idle mode may be used to boost the voltage level at gate of transistor 102 to approximately twice the voltage level of VCC.

In the embodiment of FIG. 4, the voltage level at the gate of transistor 102 may be boosted for at least a period of time, Tco. In an exemplary embodiment, Tco, may be a time delay that represents the maximum time required to obtain a valid output at an output terminal after a clock transition at a clock input terminal. Therefore, in one embodiment, the voltage level is boosted for a substantially long enough period of time for a clock signal to transition from one logic level to another logic level.

As the voltage at the gate of transistor 102 is boosted when the memory circuit 120 is in an active mode, memory circuit 120 may receive a positive voltage level, VCC, when memory circuit 120 is in an active mode. In an exemplary embodiment, memory circuit 120 may perform read and write operations during the active mode.

In an exemplary embodiment, the memory circuit may switch back and forth from an inactive or idle mode to an active mode based on a clock signal. For instance, when the clock signal, CLK, represented by waveform 405, is at a logic low level (e.g., VSS) and when memory circuit 120 is not placed in a sleep mode, memory circuit 120 may be placed in an inactive mode. When the clock signal, CLK, represented by waveform 405, transitions from the logic low level to a logic high level (e.g., VCC) and when memory circuit 120 is not placed in a sleep mode, memory circuit 120 may consequently transition to an active mode. Consequently, when the clock signal, CLK, transitions from the logic high level back to the logic low level, memory circuit 120 may then transition from the active mode back to the inactive mode. In one embodiment, memory circuit 120 may be used in a low-speed application, such as an application that runs at 10 MHz or lower. The clock signal, CLK, may be generated at the same frequency as other signals using in controlling memory circuit 120 such as address signals, word line signals, etc. As one example, the clock signal, CLK, may mirror word line signals used in addressing memory elements in memory circuit 120.

Figure 5:
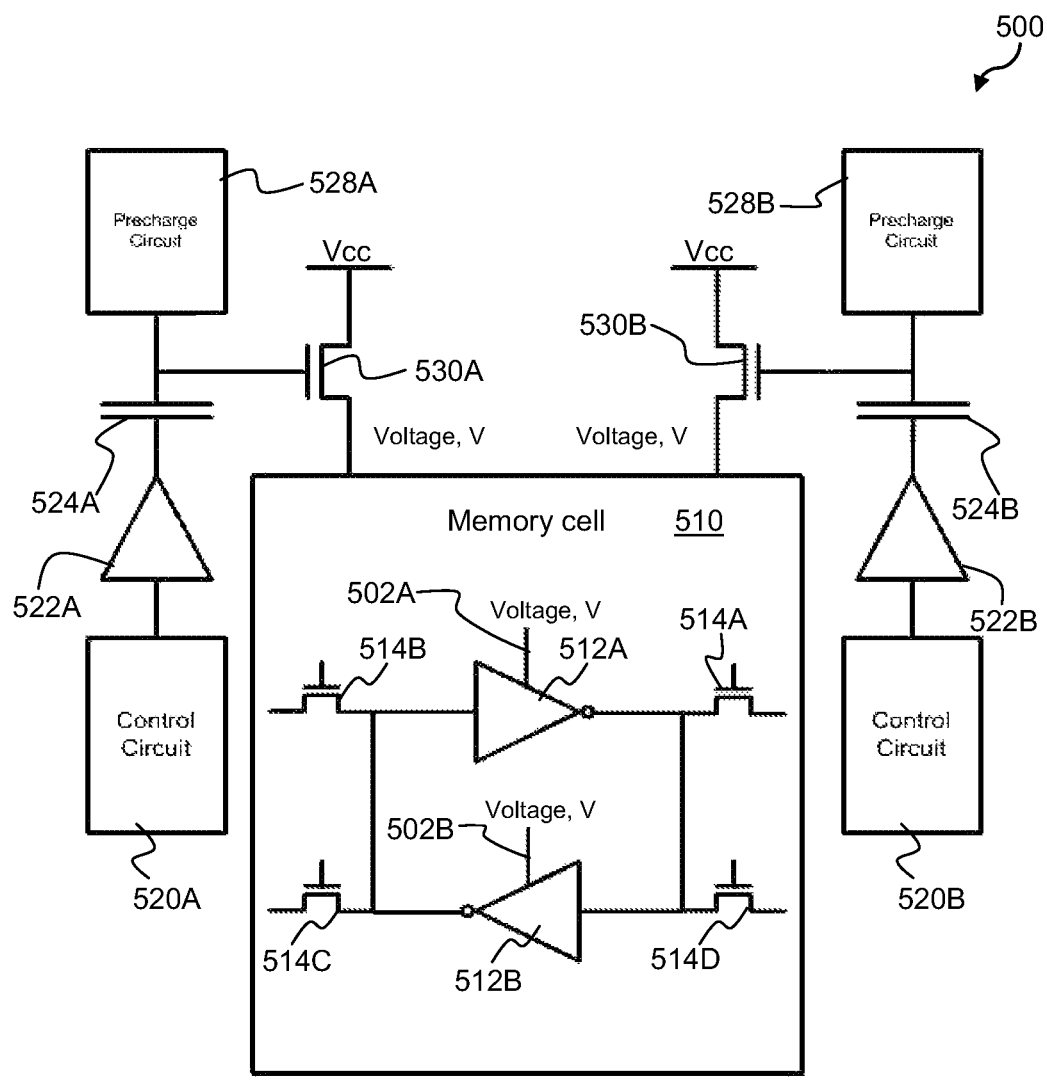
FIG. 5 is an illustrative schematic representation of a memory cell circuit coupled to two precharge circuits through two transistors.

FIG. 5, meant to be illustrative and not limiting, is a schematic representation of a memory cell circuit 510 coupled to precharge circuits 528A and 528B through transistors 530A and 530B respectively. Memory cell circuit 510 includes two back-to-back coupled inverters 512A and 512B coupled to transistors 514A-514D. In one embodiment, transistors 514A and 514B may control a first word line, and transistors 514C and 514D may control a second word line. It should be appreciated that memory cell circuit 510 may be a dual port memory cell. In one embodiment, dual port memory cell 510 may have two ports that are phase shifted by 90 degrees from each other. Accordingly, in an exemplary embodiment, one of the ports may be at a precharging state while the other port may be at a boosting state at any one time.

Enable lines 502A and 502B of inverters 512A and 512B, respectively, may be coupled to receive a voltage level, V, from transistors 530A and 530B. A source-drain terminal of each of transistors 530A and 530B may be coupled to a positive voltage level (e.g., VCC). In one embodiment, memory cell circuit 510 may be turned on or off or placed in an idle mode based on the voltage level, V, received from transistors 530A and 530B.

In the embodiment of FIG. 5, the gate of transistor 530A is coupled to capacitor 524A and the gate of transistor 530B is coupled to capacitor 524B. Capacitors 524A and 524B may be boosting capacitors that may be used to increase a voltage level at the gate of transistors 530A and 530B. The voltage level supplied to the gate of transistors 530A and 530B is controlled by control circuit 520A and 520B, respectively.

In an exemplary embodiment, control circuit 520A and control circuit 520B may be similar to logic circuit 210 of FIG. 2. Buffers 522A and 522B may be coupled to the output of control circuits 520A and 520B, respectively, to boost an output signal received from control circuits 520A and 520B. According to one embodiment, precharge circuits 528A and 528B may be similar to precharge circuit 230 of FIG. 2.

Control circuits 520A and 520B may be operable to receive an enable signal and a clock signal. In one embodiment, the enable signal is a sleep enable signal that may be used to power down memory cell circuit 510. Memory cell circuit 510 may be placed in different operating states depending on the enable signal and the clock signal received. In one embodiment, memory cell circuit 510 may be placed in a reduced power consumption state when both the enable signal and the clock signal are at a logic low level. In this embodiment, a positive voltage level that may be relatively lower than VCC may be supplied to memory cell circuit 510 through transistor 530A or 530B.

In another embodiment, memory cell circuit 510 may be placed in an active state when the enable signal is at a logic low level and the clock signal is at a logic high level. In this embodiment, a positive voltage level that may be slightly higher than VCC may be supplied to memory cell circuit 510 through transistor 530A or 530B. In one embodiment, precharge circuits 528A and 528B may charge capacitors 524A and 524B, respectively, during a previous inactive state, and the charge stored in capacitors 525A and 524B may be used to boost the voltage level supplied to the gate of transistors 530A or 530B when memory cell circuit 510 is in an active state. In an exemplary embodiment, memory cell circuit 510 may be operable to perform a read or a write operation during an active state.

In yet another embodiment, memory cell circuit 510 may be placed in a powered down state when the enable signal is a logic high level. In one embodiment, the enable signal may be used to turn memory cell circuit 510 on and off. A low voltage level (e.g., a ground voltage) may be supplied to memory cell circuit 510 when the enable signal is at a logic high level. In an exemplary embodiment, memory cell circuit 510 may form a memory array on a programmable logic device and the enable signal may be a configuration bit on the programmable logic device.

Figure 6:
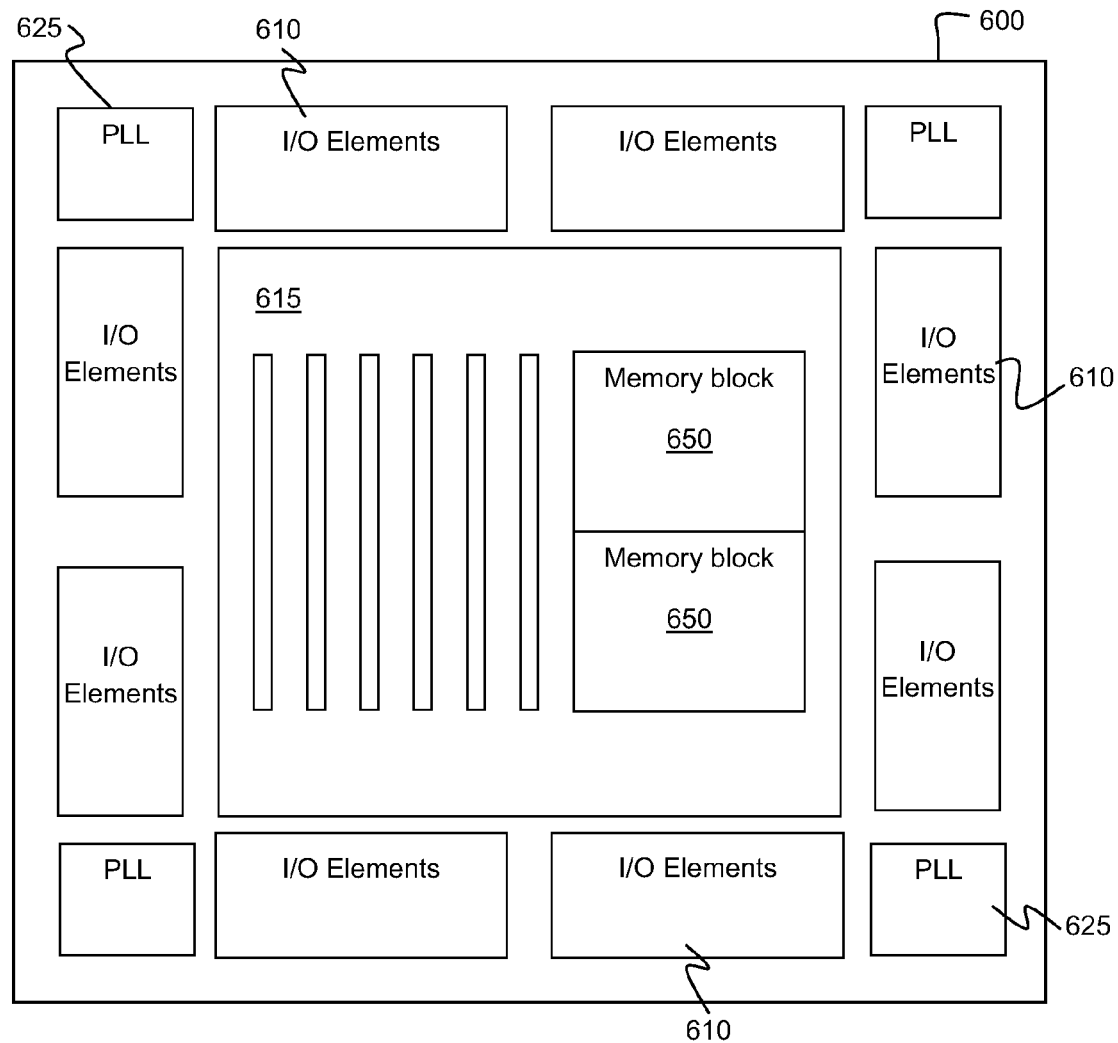
FIG. 6 is an illustrative simplified block diagram of an IC in accordance with an embodiment of the present invention.

FIG. 6, meant to be illustrative and not limiting, shows a simplified block diagram of integrated circuit (IC) 600 that can implement embodiments of the present invention. IC 600 includes core logic region 615 and input-output elements 610. Other auxiliary circuits such as phase-locked loops (PLLs) 625 for clock generation and timing, can be located outside the core logic region 615, for instance, at corners of IC 600 and adjacent to input-output elements 610.

Core logic region 615 may be populated with logic cells that may include "logic elements" (LEs), among other circuits. LEs may include look-up table-based logic regions and may be grouped into "Logic Array Blocks" (LABs). The LEs and groups of LEs or LABs can be configured to perform logical functions desired by the user. Configuration data loaded into configuration memory can be used to produce control signals that configure the LEs and groups of LEs and LABs to perform the desired logical functions. Core logic region 615 may also include a plurality of embedded memory blocks 650 that can be used to perform a variety of functions. It should be appreciated that embedded memory blocks 650 may be similar to memory cell circuit 510 of FIG. 5 and embedded memory blocks 650 may be placed in different operating modes, such as active mode, idle mode and sleep mode, based on a voltage level received from voltage control circuitry similar to voltage control circuitry 110 of FIG. 1.

Input-output elements 610 may also include input-output buffers that connect IC 600 to other external components. Signals from core region 615 are transmitted through input-output elements 610 to external components that may be connected to IC 600. A single device like IC 600 can potentially support a variety of different interfaces and each individual input-output bank 610 can support a different input-output standard with a different interface or a different voltage level.

IC 600 receives signals from external circuitry at input-output elements 610. Signals may be routed from input-output elements 610 to core logic region 615 and other logic blocks on IC 600. Core logic region 615 and other logic blocks on IC 600 may perform functions based on the signals received. Signals may be sent from core logic region 615 and other relevant logic blocks of IC 600 to other external circuitry or components that may be connected to IC 600 through input-output elements 610.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A circuit comprising:
   a memory circuit;
   a sleep circuit having an output terminal coupled to the memory circuit, wherein the sleep circuit is operable to receive a control signal and further operable to place the memory circuit in one of a first mode of operation, a second mode of operation, and a third mode of operation based at least partly on the control signal; and
   a control circuit having an output terminal coupled to an input terminal of the sleep circuit, wherein the control circuit is operable to receive an enable signal and wherein the control circuit is operable to supply the control signal to the sleep circuit at a first voltage level during a first mode of operation, a second voltage level during a second mode of operation, and a third voltage level during a third mode of operation based at least partly on the enable signal, wherein the enable signal comprises a clock signal and a sleep mode signal and wherein the control circuit comprises:
   a logic circuit having an output terminal coupled to the output terminal of the control circuit and input terminals coupled to receive the clock signal and an inverted version of the sleep mode signal; and
   a precharge circuit coupled to receive the clock signal and the sleep mode signal, and coupled to the output terminal of the logic circuit, wherein the precharge circuit is operable to enhance the first voltage level to the second voltage level during the second mode of operation.

2. The circuit defined in claim 1, wherein the sleep circuit comprises:
   a first transistor having a source-drain terminal coupled to the output terminal of the sleep circuit and a gate coupled to the input terminal of the sleep circuit.

3. The circuit defined in claim 2, wherein the precharge circuit comprises:
   a second transistor having a gate coupled to receive the sleep mode signal and a source-drain terminal coupled to the output terminal of the control circuit;
   a third transistor having a gate coupled to receive the clock signal and a source-drain terminal coupled to the source-drain terminal of the second transistor and the output terminal of the control circuit; and
   a fourth transistor having a gate coupled to receive the sleep mode signal and coupled in series to the third transistor.

4. The circuit defined in claim 3, wherein the first and second transistors are N-channel transistors and wherein the third and fourth transistors P-channel transistors.

5. A circuit comprising:
   a memory circuit;
   a sleep circuit having an output terminal coupled to the memory circuit, wherein the sleep circuit is operable to receive a control signal and further operable to place the memory circuit in one of a first mode of operation, a second mode of operation, and a third mode of operation based at least partly on the control signal; and
   a control circuit having an output terminal coupled to an input terminal of the sleep circuit, wherein the control circuit is operable to receive an enable signal and wherein the control circuit is operable to supply the control signal to the sleep circuit at a first voltage level during a first mode of operation, a second voltage level during a second mode of operation, and a third voltage level during a third mode of operation based at least partly on the enable signal, wherein the second voltage level is greater than the first voltage level, wherein the first and second voltage levels are each greater than the third voltage level, wherein the memory circuit is operable to retain previous stored data when in the first mode, wherein the memory circuit is operable to perform one of a read and write function when in the second mode, and wherein the memory circuit is inoperable when in the third mode.

6. A circuit comprising:
   a memory circuit;
   a sleep circuit having an output terminal coupled to the memory circuit, wherein the sleep circuit is operable to receive a control signal and further operable to place the memory circuit in one of a first mode of operation, a second mode of operation, and a third mode of operation based at least partly on the control signal; and
   a control circuit having an output terminal coupled to an input terminal of the sleep circuit, wherein the control circuit is operable to receive an enable signal and wherein the control circuit is operable to supply the control signal to the sleep circuit at a first voltage level during a first mode of operation, a second voltage level during a second mode of operation, and a third voltage level during a third mode of operation based at least partly on the enable signal, wherein the circuit is included in a programmable logic device that includes configuration memory operable to provide the sleep mode signal and wherein the clock signal is a clock signal in the programmable logic device.

7. A circuit operable to generate power supply signals for a memory element comprising:
   a logic circuit having an output terminal and first and second input terminals coupled to receive an enable signal and a clock signal, respectively;
   a first transistor having a gate coupled to receive the enable signal; and a second transistor coupled in series to the first transistor and having a gate coupled to receive the clock signal and a source-drain terminal coupled to the output terminal of the logic circuit, wherein the circuit is operable to generate the power supply signals for the memory element at one of first, second and third voltage levels based on the enable signal and the clock signal.

8. The circuit defined in claim 7,
further comprising:
a third transistor having a gate coupled to receive the enable signal and a source-drain terminal coupled to the output terminal of the logic circuit; and
a boosting capacitor circuit coupled between the output terminal of the logic circuit and the source-drain terminals of the second and third transistors, wherein the boosting capacitor is operable to boost the power supply signals from the first voltage level to the second voltage level based on the enable signal and the clock signal.

9. The circuit defined in claim 7 further comprising:
a fourth transistor having a gate coupled to receive the one of the first, second and third voltage levels; and
a memory circuit coupled to the fourth transistor, wherein the fourth transistor is operable to place the memory circuit in one of an idle state, an active state and a powered down state.

10. The circuit defined in claim 9, wherein the first and second voltage levels are positive voltage levels, wherein the second voltage level is greater than the first voltage level, and wherein the third voltage level is a ground voltage.

11. The circuit defined in claim 9, wherein the memory circuit is operable to retain previous stored data when in the idle state and wherein the memory circuit is inoperable when in the powered down state.

12. The circuit defined in claim 9, wherein the memory circuit is in the idle state when the clock signal is at a low logic level.

13. A method of operating a memory circuit in an integrated circuit, the method comprising:
operating the memory circuit in an active mode by providing a first power supply voltage to a power supply terminal in the memory circuit;
operating the memory circuit in an idle mode by providing a second power supply voltage to the power supply terminal in the memory circuit, wherein any data stored by the memory circuit is retained while the memory circuit is in the idle mode; and
switching operation of the memory circuit between the active and idle modes in response to a clock signal in the integrated circuit.

14. The method defined in claim 13 wherein switching operation of the memory circuit between the active and idle modes in response to the clock signal comprises:
switching operation of the memory circuit from the idle mode to the active mode each time the clock signal transitions from a first logic level to a second logic level; and
switching operation of the memory circuit from the active mode to the idle mode each time the clock signal transitions from the second logic level to the first logic level.

15. The method of claim 14 wherein the first logic level is a logic low level and the second logic level is a logic high level and wherein the memory circuit consumes less power in the idle mode than in the active mode.

16. The method of claim 14 wherein the first power supply voltage comprises a positive power supply voltage that is greater than the second power supply voltage.

17. The method of claim 14 wherein the second power supply voltage comprises a ground power supply voltage that is less than the first power supply voltage.

18. The method of claim 13 further comprising:
providing a sleep signal at a first logic level, wherein operating the memory circuit in the active and idle modes comprises operating the memory circuit in at least one of the active and idle modes whenever the sleep signal is at the first logic level;
providing the sleep signal at a second logic level; and
whenever the sleep signal is at the second logic level, operating the memory circuit in a sleep mode by providing a third power supply voltage to the power supply terminal in the memory circuit, wherein any data stored by the memory circuit is lost while the memory circuit is in the sleep mode.

19. The method defined in claim 18 wherein the power supply terminal in the memory circuit comprises a positive power supply terminal, wherein the second power supply voltage comprises a positive power supply, wherein the first power supply voltage comprises an elevated positive power supply that is greater than the positive power supply, and wherein the third power supply voltage comprises a ground power supply voltage.

* * * * *